(12) United States Patent
Chang et al.

(10) Patent No.: US 8,445,064 B2
(45) Date of Patent: May 21, 2013

(54) COMPOSITION FOR LIGHT EMITTING BODY-POLYMER COMPOSITE, LIGHT EMITTING BODY-POLYMER COMPOSITE, AND LIGHT EMITTING DEVICE INCLUDING THE LIGHT EMITTING BODY-POLYMER COMPOSITE

(75) Inventors: Won-Suk Chang, Suwon-si (KR); Eun-Joo Jang, Suwon-si (KR); Shin-Ae Jun, Seongnam-si (KR); Hyo-Sook Jang, Seongnam-si (KR); Seok-Hwan Hong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 304 days.

(21) Appl. No.: 12/705,337

(22) Filed: Feb. 12, 2010

(65) Prior Publication Data

US 2011/0006321 A1    Jan. 13, 2011

(30) Foreign Application Priority Data

Jul. 9, 2009    (KR) ........................ 10-2009-0062752

(51) Int. Cl.
*B01J 13/02*    (2006.01)
*B01J 13/14*    (2006.01)

(52) U.S. Cl.
USPC ..................... 427/213.33; 427/213.3; 257/98; 257/100

(58) Field of Classification Search
USPC ..................... 427/213.33, 213.3; 257/98, 100
See application file for complete search history.

(56) References Cited

U.S. PATENT DOCUMENTS

| | | | |
|---|---|---|---|
| 6,501,091 B1 | 12/2002 | Bawendi et al. | |
| 6,677,404 B1 * | 1/2004 | Naruse | ........................ 525/192 |
| 6,803,719 B1 | 10/2004 | Miller et al. | |
| 6,870,311 B2 | 3/2005 | Mueller et al. | |
| 6,890,777 B2 | 5/2005 | Bawendi et al. | |

(Continued)

FOREIGN PATENT DOCUMENTS

| | | |
|---|---|---|
| JP | 2005-183897 A | 7/2005 |
| JP | 2005-255790 A | 9/2005 |

(Continued)

OTHER PUBLICATIONS

You, "Organic/inorganic hybrid copolymer for light emitting material," Polymer Preprints—America, 2001, vol. 43; Part 1, pp. 623-624.*

*Primary Examiner* — N Drew Richards
*Assistant Examiner* — Peter Bradford
(74) *Attorney, Agent, or Firm* — Cantor Colburn LLP (57) ABSTRACT

A composition for a light emitting body-polymer composite, the composition including a light emitting body; and a cross-linkable composition including a monomer represented by Chemical Formula 1.

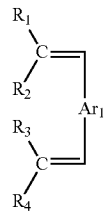

Chemical Formula 1

A light emitting body-polymer composite prepared by cross-linking the composition and a light emitting device including the light emitting body-polymer composite are also provided.

17 Claims, 7 Drawing Sheets

U.S. PATENT DOCUMENTS

| | | |
|---|---|---|
| 6,914,265 B2 | 7/2005 | Bawendi et al. |
| 7,083,490 B2 | 8/2006 | Mueller et al. |
| 7,264,527 B2 | 9/2007 | Bawendi et al. |
| 7,374,807 B2 | 5/2008 | Parce et al. |
| 2006/0024493 A1* | 2/2006 | Jones et al. .................. 428/327 |
| 2006/0068154 A1 | 3/2006 | Parce et al. |
| 2006/0074147 A1* | 4/2006 | Mayo ........................... 523/171 |
| 2006/0116476 A1* | 6/2006 | Cheng .......................... 525/120 |
| 2008/0020235 A1 | 1/2008 | Parce et al. |
| 2008/0173886 A1 | 7/2008 | Cheon et al. |
| 2008/0174233 A1 | 7/2008 | Bawendi et al. |
| 2009/0149954 A1* | 6/2009 | Hu et al. .................... 623/16.11 |
| 2009/0317623 A1* | 12/2009 | Purdy et al. ................... 428/327 |

FOREIGN PATENT DOCUMENTS

| | | |
|---|---|---|
| JP | 2006-241365 A | 9/2006 |
| JP | 2008-166406 A | 7/2008 |
| KR | 1020070113126 A | 11/2007 |
| KR | 1020080014830 A | 2/2008 |
| KR | 1020080082295 A | 9/2008 |

\* cited by examiner

COMPOSITION FOR LIGHT EMITTING BODY-POLYMER COMPOSITE, LIGHT EMITTING BODY-POLYMER COMPOSITE, AND LIGHT EMITTING DEVICE INCLUDING THE LIGHT EMITTING BODY-POLYMER COMPOSITE

CROSS-REFERENCE TO RELATED APPLICATION

This application claims priority to Korean Patent Application No. 10-2009-0062752, filed on Jul. 9, 2009, all the benefits accruing therefrom under 35 U.S.C. §119, the content of which in its entirety is herein incorporated by reference.

BACKGROUND

1. Field

This disclosure relates to a composition for a light emitting body-polymer composite, a light emitting body-polymer composite, and a light emitting device including the same.

2. Description of the Related Art

A light emitting device, such as a light emitting diode ("LED"), an organic light emitting device ("OLED"), or a photoluminescent ("PL") device, is applicable to various types of devices, including electric home appliances, lighting devices, display devices, and automation devices.

The light emitting device, which includes a light emitting body, may express an original color of a light emitting material, such as blue, red, or green, and the light emitting device may express white by emitting a plurality of colors from a plurality of light emitting materials, which express different colors.

The light emitting device may be generally fabricated in a packaging material or within an encapsulating structure.

The packaging material or encapsulating structure includes a transparent resin capable of passing light emitted from a light emitting body to the outside, and desirably prevents external moisture or oxygen from contacting the device. However, the transparent resin may not prevent the inflow of external moisture or oxygen, and the moisture or oxygen may deteriorate the light emitting body and shorten the life-span of the light emitting body, degrading the performance of the light emitting device. Therefore there remains a need for an improved transparent material for a light emitting body of a light emitting device.

SUMMARY

A feature, advantage, or aspect of this disclosure is a composition for a light emitting body-polymer composite, which prevents the inflow of moisture and oxygen from the outside and provides high transparency and an improved the life-span of a light emitting device.

Another aspect, feature, or advantage of this disclosure is a light emitting body-polymer composite formed by cross-linking a composition for a light emitting body-polymer composite.

Yet another aspect, feature, or advantage of this disclosure is a light emitting device including the light emitting body-polymer composite.

Disclosed is a composition for a light emitting body-polymer composite, the composition including a light emitting body; and a cross-linkable composition includina a monomer represented by the following Chemical Formula 1:

Chemical Formula 1 wherein $Ar_1$ is a substituted or unsubstituted $C_6$ to $C_{20}$ arylene, and $R_1$ to $R_4$ are independently selected from the group consisting of hydrogen, a substituted or unsubstituted $C_1$ to $C_{20}$ alkyl, a $C_3$ to $C_{20}$ cycloalkyl, a $C_1$ to $C_{20}$ heterocycloalkyl, a $C_2$ to $C_{16}$ alkynyl, a substituted or unsubstituted $C_6$ to $C_{20}$ aryl, a substituted or unsubstituted $C_1$ to $C_{20}$ alkoxy, a $C_7$ to $C_{13}$ arylalkyl, a $C_1$ to $C_4$ oxyalkyl, a $C_1$ to $C_{20}$ heteroalkyl, a $C_3$ to $C_{20}$ heteroarylalkyl, a nitro, a cyano, an amino, an azido, an amidino, a hydrazino, a hydrazono, a carbonyl, a carbamyl, a thiol, an ester, a carboxyl or a salt thereof, a sulfonic acid or a salt thereof, a phosphoric acid or a salt thereof, a halogen-containing group, and a combination thereof.

The monomer represented by Chemical Formula 1 may include the monomer represented by the following Chemical Formula 1A:

Chemical Formula 1A wherein $R_1$ to $R_4$ are the same as defined in the Chemical Formula 1, and $R_a$ to $R_d$ are independently selected from the group consisting of hydrogen, a substituted or unsubstituted $C_1$ to $C_{20}$ alkyl, a halogen-containing group, a hydroxyl, and a combination thereof.

The monomer represented by Chemical Formula 1A may include the monomer represented by the following Chemical Formula 1AA:

Chemical Formula 1AA

-continued or a combination thereof, wherein $R_1$ to $R_4$ are the same as defined in Chemical Formula 1.

The cross-linkable composition may further include the monomer represented by the following Chemical Formula 2:

Chemical Formula 2 wherein $R_5$ to $R_8$ are independently selected from the group consisting of hydrogen, a substituted or unsubstituted $C_1$ to $C_{20}$ alkyl, a $C_3$ to $C_{20}$ cycloalkyl, a $C_1$ to $C_{20}$ heterocycloalkyl, a $C_2$ to $C_{16}$ alkynyl, a substituted or unsubstituted $C_6$ to $C_{20}$ aryl, a substituted or unsubstituted $C_1$ to $C_{20}$ alkoxy, a $C_7$ to $C_{13}$ arylalkyl, a $C_1$ to $C_4$ oxyalkyl, a $C_1$ to $C_{20}$ heteroalkyl, a $C_3$ to $C_{20}$ heteroarylalkyl, a nitro, a cyano, an amino, an azido, an amidino, a hydrazino, a hydrazono, a carbonyl, a carbamyl, a thiol, an ester, a carboxyl or a salt thereof, a sulfonic acid or a salt thereof, a phosphoric acid or a salt thereof, a halogen-containing group, and a combination thereof, provided that at least one of $R_7$ and $R_8$ is a $C_1$ to $C_{20}$ alkyl.

The monomer represented by Chemical Formula 1 and the monomer represented by Chemical Formula 2 may be included in an amount of about 5 to about 70 volume percent ("%") and about 30 to about 95 volume %, respectively, based on the total amount of the cross-linkable composition.

The cross-linkable composition may further include at least one of a monomer represented by the following Chemical Formula 3 and a monomer including at least two (meth) acrylate groups:

Chemical Formula 3 wherein $Ar_2$ is a substituted or unsubstituted $C_6$ to $C_{20}$ aryl, and $R_9$ and $R_{10}$ are independently selected from the group consisting of hydrogen, a substituted or unsubstituted $C_1$ to $C_{20}$ alkyl, a $C_3$ to $C_{20}$ cycloalkyl, a $C_1$ to $C_{20}$ heterocycloalkyl, a $C_2$ to $C_{16}$ alkynyl, a substituted or unsubstituted $C_6$ to $C_{20}$ aryl, a substituted or unsubstituted $C_1$ to $C_{20}$ alkoxy, a $C_7$ to $C_{13}$ arylalkyl, a $C_1$ to $C_4$ oxyalkyl, a $C_1$ to $C_{20}$ heteroalkyl, a $C_3$ to $C_{20}$ heteroarylalkyl, a nitro, a cyano, an amino, an azido, an amidino, a hydrazino, a hydrazono, a carbonyl, a carbamyl, a thiol, an ester, a carboxyl or a salt thereof, a sulfonic acid or a salt thereof, a phosphoric acid or a salt thereof, a halogen-containing group, and a combination thereof.

The monomer represented by Chemical Formula 3 includes the monomer represented by the following Chemical Formula 3A:

Chemical Formula 3A wherein $R_9$ and $R_{10}$ are the same as defined in Chemical Formula 3, and $R_e$ to $R_i$ are independently selected from the group consisting of hydrogen, a substituted or unsubstituted $C_1$ to $C_{20}$ alkyl, a halogen-containing group, a hydroxyl, and a combination thereof.

The monomer represented by Chemical Formula 3 may be included in an amount of about 2 to about 50 volume %, based on the total amount of the cross-linkable composition.

The monomer including at least two (meth)acrylate groups may include a monomer represented by Chemical Formula 4:

Chemical Formula 4 wherein $R_{11}$ to $R_{16}$ are independently selected from the group consisting of hydrogen, a substituted or unsubstituted $C_1$ to $C_{20}$ alkyl, a $C_3$ to $C_{20}$ cycloalkyl, a $C_1$ to $C_{20}$ heterocycloalkyl, a $C_2$ to $C_{16}$ alkynyl, a substituted or unsubstituted $C_6$ to $C_{20}$ aryl, a substituted or unsubstituted $C_1$ to $C_{20}$ alkoxy, a $C_7$ to $C_{13}$ arylalkyl, a $C_1$ to $C_4$ oxyalkyl, a $C_1$ to $C_{20}$ heteroalkyl, a $C_3$ to $C_{20}$ heteroarylalkyl, a nitro, a cyano, an amino, an azido, an amidino, a hydrazino, a hydrazono, a carbonyl, a carbamyl, a thiol, an ester, a carboxyl or a salt thereof, a sulfonic acid or a salt thereof, a phosphoric acid or a salt thereof, a halogen-containing group, and a combination thereof, and $R_{17}$ is selected from the group consisting of a substituted or unsubstituted $C_1$ to $C_{20}$ alkylene, a substituted or unsubstituted $C_3$ to $C_{20}$ cycloalkylene, a substituted or unsubstituted $C_6$ to $C_{20}$ arylene, a substituted or unsubstituted $C_2$ to $C_{20}$ heteroarylene, and a combination thereof.

The monomer including at least two (meth)acrylate groups may be included in an amount of about 2 to about 50 volume %, based on the total amount of the cross-linkable composition.

According to another aspect, feature, or advantage of this disclosure, a light emitting body-polymer composite may be prepared by cross-linking the composition for the light emitting body-polymer composite.

In an embodiment, the cross-linked composition has a refractive index of about 1.4 to about 1.6.

Also disclosed is a light emitting device, including: a light emitting body-polymer composite including a light emitting body and a cross-linked resin, wherein the cross-linked resin includes a polymerization product of the monomer represented by the Chemical Formula 1:

Chemical Formula 1 wherein $Ar_1$ is a substituted or unsubstituted $C_6$ to $C_{20}$ arylene, and $R_1$ to $R_4$ are independently selected from the group consisting of hydrogen, a substituted or unsubstituted $C_1$ to $C_{20}$ alkyl, a $C_3$ to $C_{20}$ cycloalkyl, a $C_1$ to $C_{20}$ heterocycloalkyl, a $C_2$ to $C_{16}$ alkynyl, a substituted or unsubstituted $C_6$ to $C_{20}$ aryl, a substituted or unsubstituted $C_1$ to $C_{20}$ alkoxy, a $C_7$ to $C_{13}$ arylalkyl, a $C_1$ to $C_4$ oxyalkyl, a $C_1$ to $C_{20}$ heteroalkyl, a $C_3$ to $C_{20}$ heteroarylalkyl, a nitro, a cyano, an amino, an azido, an amidino, a hydrazino, a hydrazono, a carbonyl, a carbamyl, a thiol, an ester, a carboxyl or a salt thereof, a sulfonic acid or a salt thereof, a phosphoric acid or a salt thereof, a halogen-containing group, and a combination thereof.

The cross-linked resin may further include a polymerization product of a monomer represented by the Chemical Formula 2.

The cross-linked resin may further include at least one of a polymerization product of a monomer represented by Chemical Formula 3 and a polymerization product of a monomer including a least two (meth)acrylate groups.

The light emitting device may further include a light emitting diode that provides the light emitting body-polymer composite with light.

The light emitting diode and the light emitting body may emit light, the light emitting body may emit light having a wavelength which is longer than a wavelength of the light emitted from the light emitting diode, and the combination of the light emitting diode and the light emitting body emit white light.

The light emitting device may further include a first electrode disposed on a first side of the light emitting body-polymer composite, and a second electrode disposed on a second side of the light emitting body-polymer composite, wherein the first side is opposite the second side.

The light emitting body-polymer composite may have a spherical shape.

The light emitting device may further include a polymer resin surrounding the light emitting body-polymer composite, and the polymer resin may include an epoxy resin, a silicone resin, or a combination thereof.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Exemplary embodiments will be described more fully hereinafter with reference to the accompanying drawings. The present invention may, however, be embodied in many different forms and should not be construed as limited to the exemplary embodiments set forth herein.

As used herein, unless otherwise provided, the term "substituted" refers to a compound or group substituted with one selected from the group consisting of a halogen, such as F, Cl, Br, and I, a hydroxy, an alkoxy, a nitro, a cyano, an amino, an azido, an amidino, a hydrazino, a hydrazono, a carbonyl, a carbamyl, a thiol, an ester, a carboxyl or a salt thereof, a sulfonic acid or a salt thereof, a phosphoric acid or a salt thereof, a $C_1$ to $C_{20}$ alkyl, a $C_2$ to $C_{16}$ alkynyl, a $C_6$ to $C_{20}$ aryl, a $C_7$ to $C_{13}$ arylalkyl, a $C_1$ to $C_4$ oxyalkyl, a $C_1$ to $C_{20}$ heteroalkyl, a $C_3$ to $C_{20}$ heteroarylalkyl, a $C_3$ to $C_{20}$ cycloalkyl, a $C_3$ to $C_{15}$ cycloalkenyl, a $C_6$ to $C_{15}$ cycloalkynyl, a heterocycloalkyl, and combinations thereof, instead of at least one hydrogen of the designated compound or group.

As used herein, unless otherwise provided, the term, "hetero" refers to a compound or group including 1 to 3 heteroatoms selected from the group consisting of N, O, S, and P, and a combination thereof.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present invention.

The terminology used herein is for the purpose of describing particular embodiments only and is not intended to be limiting. As used herein, the terms "a" and "an" are open terms that may be used in conjunction with singular items or with plural items. Thus as used herein, the singular forms "a," "an," and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, the term "(meth)acrylate" refers to both acrylate and methacrylate.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, the term "and/or" includes any and all combinations of one or more of the associated listed items.

Figure 1:
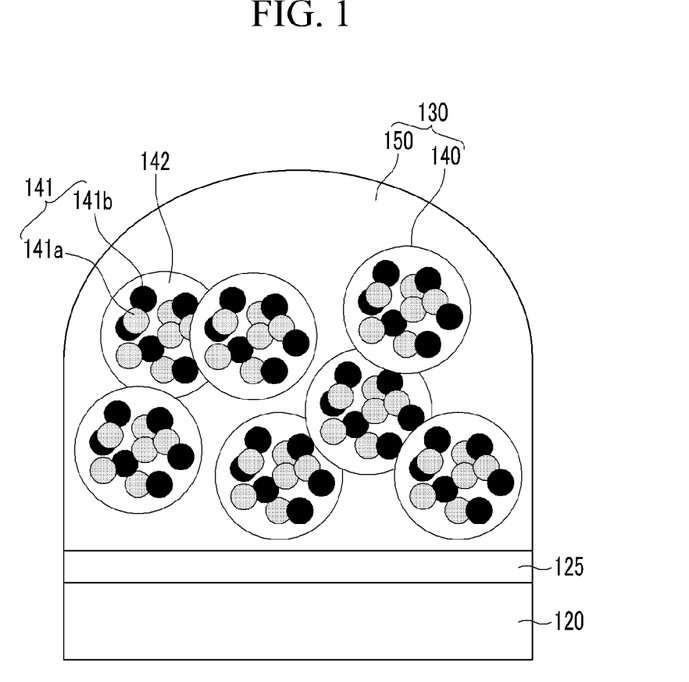
FIG. 1 is a schematic view showing an exemplary embodiment of a light emitting device.

Hereinafter, an exemplary embodiment of the light emitting device is described with reference to FIG. 1. FIG. 1 is a schematic view showing an exemplary embodiment of a light emitting device.

Referring to FIG. 1, the light emitting device according to an embodiment includes a light source 120, a medium layer 125 disposed on the light source 120, and a transparent resin layer 130 disposed on the medium layer 125.

The light source 120 supplies light to the transparent resin layer 130 and may include a light emitting diode ("LED"). The light emitting diode may comprise an inorganic semiconductor material and include, for example, an InGaN compound, an AlGaN compound, an InGaAlN compound, or a combination thereof. The light emitting diode may be connected to a lead frame (not shown), which is electrically connected with an external power source, and emits visible light having a certain color when electric power is applied. The light emitting diode may include, for example, a blue light emitting diode, which emits blue light.

The medium layer 125 is a medium (e.g., material), which is capable of passing the light supplied from the light source 120 to the transparent resin layer 130, and comprises, for example, air, vacuum, a transparent resin, a liquid crystal, or a combination thereof. The medium layer 125 physically separates the light source 120 and the transparent resin layer 130, and it may be omitted.

The transparent resin layer 130 includes a light emitting body-polymer composite 140 having a spherical shape and a polymer resin 150 surrounding the light emitting body-polymer composite 140. The polymer resin 150 may be on a surface of the light emitting body-polymer composite 140 and may comprise a polymer.

A light emitting body-polymer composite 140 includes a light emitting body 141 and a cross-linkable resin 142.

The light emitting body 141 includes a photoluminescent material, which emits light upon excitation by light, and may include, for example, a phosphor, a quantum dot such as a semiconductor nanocrystal, or a combination thereof. The phosphor may include, for example, a blue phosphor, a green phosphor, a red phosphor, or a combination thereof.

The blue phosphor, for example, may include at least one phosphor selected from $(Sr,Ba,Ca)_5(PO_4)_3Cl:Eu^{2+}$; $BaMg_2Al_{16}O_{27}:Eu^{2+}$; $Sr_4Al_{14}O_{25}:Eu^{2+}$; $BaAl_8O_{13}:Eu^{2+}$; $BaMgAl_{10}O_{17}:Eu^{2+}$ and $Sr_2Si_3O_8.2SrCl_2:Eu^{2+}$; $Ba_3MgSi_2O_8:Eu^{2+}$; or $(Sr,Ca)_{10}(PO_4)_6.nB_2O_3:Eu^{2+}$ (n=1-30), or the like.

The green phosphor, for example, may include at least one phosphor selected from $(Ba,Sr,Ca)_2SiO_4:Eu^{2+}$; $Ba_2MgSi_2O_7:Eu^{2+}$; $Ba_2ZnSi_2O_7:Eu^{2+}$; $BaAl_2O_4:Eu^{2+}$; $SrAl_2O_4:Eu^{2+}$; $BaMgAl_{10}O_{17}:Eu^{2+}$, $Mn^{2+}$; or $BaMg_2Al_{16}O_{27}:Eu^{2+}$, $Mn^{2+}$, or the like.

The red phosphor, for example, may include at least one phosphor selected from $(Ba,Sr,Ca)_2Si_5N_8:Eu^{2+}$; $(Sr,Ca)AlSiN_3:Eu^{2+}$; $Y_2O_3:Eu^{3+},Bi^{3+}$; $(Ca,Sr)S:Eu^{2+}$; $CaLa_2S_4:Ce^{3+}$; $(Sr,Ca,Ba)_2P_2O_7:Eu^{2+},Mn^{2+}$; $(Ca,Sr)_{10}(PO_4)_6(F,Cl):Eu^{2+},Mn^{2+}$; $(Y,Lu)_2WO_6:Eu^{3+},Mo^{6+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)BO_3:Eu^{3+},Bi^{3+}$; $(Gd,Y,Lu,La)(P,V)O_4:Eu^{3+},Bi^{3+}$; or $(Ba,Sr,Ca)MgP_2O_7:Eu^{2+},Mn^{2+}$, or the like.

The semiconductor nanocrystal is not specifically limited, and may be selected from the group consisting of a Group II-VI semiconductor compound, a Group II-V semiconductor compound, a Group III-VI semiconductor compound, a Group III-V semiconductor compound, a Group IV-VI semiconductor compound, a Group II-III-VI compound, a Group II-IV-VI compound, a Group II-IV-V compound, alloys thereof, and a combination thereof, wherein the Groups II, III, IV, V and VI, for example, refer to groups of the periodic table of the elements.

The Group II element may include, for example, Zn, Cd, Hg, or a combination thereof; the Group III element may include, for example, Al, Ga, In, Ti, or a combination thereof; and the Group IV element may include, for example, Si, Ge, Sn, Pb, or a combination thereof. The Group V element may include, for example, P, As, Sb, Bi, or a combination thereof; and the Group VI element may include, for example, O, S, Se, Te, or a combination thereof.

The Group II-VI semiconductor compound may be selected from the group consisting of, for example, a binary element compound such as CdS, CdSe, CdTe, ZnS, ZnSe, ZnTe, ZnO, HgS, HgSe, HgTe, and the like; a ternary element compound such as CdSeS, CdSeTe, CdالسTe, ZnSeS, ZnSeTe, ZnالسTe, HgSeS, HgSeTe, HgالسTe, CdZnS, CdZnSe, CdZnTe, CdHgS, CdHgSe, CdHgTe, HgZnS, HgZnSe, and the like; and a quaternary element compound such as CdZnSeS, CdZnSeTe, CdZnالسTe, CdHgSeS, CdHgSeTe, CdHgالسTe, HgZnSeS, HgZnSeTe, HgZnSTe, and the like, and a combination thereof. In addition, the Group III-V semiconductor compound may be selected from the group consisting of, for example, a binary element compound such as GaN, GaP, GaAs, GaSb, AlN, AlP, AlAs, AlSb, InN, InP, InAs, InSb, and the like; a ternary element compound such as GaNP, GaNAs, GaNSb, GaPAs, GaPSb, AlNP, AlNAs, AlNSb, AlPAs, AlPSb, InNP, InNAs, InNSb, InPAs, InPSb, GaAlNP, AlGaN, AlGaP, AlGaAs, AlGaSb, InGaN, InGaP, InGaAs, InGaSb, AlInN, AlInP, AlinAs, AlInSb, and the like; and a quaternary element compound such as GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and the like, and a combination thereof. The Group IV-VI compound may be selected from the group consisting of, for example, a binary element compound such as SnS, SnSe, SnTe, PbS, PbSe, PbTe, and the like; a ternary element compound such as SnSeS, SnSeTe, SnSTe, PbSeS, PbSeTe, PbSTe, SnPbS, SnPbSe, SnPbTe, and the like; or a quaternary element compound such as SnPbSSe, SnPbSeTe, SnPbSTe, and the like, and a combination thereof.

The semiconductor nanocrystal may have a core-shell structure. The shell may include a least one layer and includes, for example, a Group II-VI semiconductor, a Group III-V semiconductor, a Group IV-VI semiconductor, or a combination thereof.

The semiconductor nanocrystal may comprise a multi-layered structure consisting of two or more kinds of materials. The semiconductor nanocrystal having a multi-layered structure may include an alloy interlayer including at least two kinds of materials in interposed between layers, and the alloy interlayer may be an alloy layer having a gradient of a material composition.

In addition, the semiconductor nanocrystal may have a surface capped with an organic ligand. The organic ligand may include, for example, a thiol, an amine, a phosphine, a carboxylic acid, or the like, or a combination thereof. The organic ligand may include a $C_6$ to $C_{24}$ alkane or alkene having a —COOH terminal end group; a $C_6$ to $C_{24}$ alkane or alkene having a —PO$_3$H$_2$ terminal end group; a $C_6$ to $C_{24}$ alkane or alkene having a —PO terminal end group; a $C_6$ to $C_{24}$ alkane or alkene having a —SH terminal end group; a $C_6$ to $C_{24}$ alkane or alkene having a —NH$_2$ terminal end group, or a combination thereof. In addition, the organic ligand may include oleic acid, stearic acid, palmitic acid, hexyl phosphonic acid, n-octyl phosphonic acid, tetradecyl phosphonic acid, octadecyl phosphonic acid, trioctylphosphine oxide, n-octyl amine, hexadecyl amine, trioctylamine, or a combination thereof.

The light emitting body 141 may include a first light emitting body 141a and a second light emitting body 141b, which emit different colors than each other, and emit light of a wavelength intrinsic to the light emitting body by using light supplied from a light emitting diode of the light source 120. The light emitting body 141 emits light having a wavelength which is longer than a wavelength of the light supplied from the light emitting diode. For example, when the light source 120 includes a blue light emitting diode, the first light emitting body 141a may emit red light and the second light emitting body 141b may emit green light. However, the light emitting device is not limited thereto, and the kind of light emitting body 141 and the color of the emitted light may be varied.

The light emitted from the light emitting diode, the light emitted from the first light emitting body 141a, and the light emitted from the second light emitting body 141b may, in combination, make white light. For better understanding, clarity, and ease of description, two kinds of light emitting bodies 141a and 141b are disclosed, although the light emitting device is not limited thereto. The light emitting device may include a plurality of various kinds of light emitting bodies as long as it expresses white light in combination with the light emitted from the light emitting diode when on.

The cross-linkable resin 142 may be formed by polymerizing a cross-linkable composition including a monomer, which is capable of cross-linking.

The cross-linkable composition includes a monomer represented by the following Chemical Formula 1.

Chemical Formula 1

In Chemical Formula 1, $Ar_1$ is a substituted or unsubstituted $C_6$ to $C_{20}$ arylene, and $R_1$ to $R_4$ are independently selected from the group consisting of hydrogen, a substituted or unsubstituted $C_1$ to $C_{20}$ alkyl, a $C_3$ to $C_{20}$ cycloalkyl, a $C_1$ to $C_{20}$ heterocycloalkyl, a $C_2$ to $C_{16}$ alkynyl, a substituted or unsubstituted $C_6$ to $C_{20}$ aryl, a substituted or unsubstituted $C_1$ to $C_{20}$ alkoxy, a $C_7$ to $C_{13}$ arylalkyl, a $C_1$ to $C_4$ oxyalkyl, a $C_1$ to $C_{20}$ heteroalkyl, a $C_3$ to $C_{20}$ heteroarylalkyl, a nitro, a cyano, an amino, an azido, an amidino, a hydrazino, a hydrazono, a carbonyl, a carbamyl, a thiol, an ester, a carboxyl or a salt thereof, a sulfonic acid or a salt thereof, a phosphoric acid or a salt thereof, a halogen-containing group, and a combination thereof.

Because the monomer represented by Chemical Formula 1 has two vinyl groups, it may be cross-linked. Thereby, the cross-linked polymerization product may have a dense and rigid structure. In addition, when at least one of $R_1$ to $R_4$ is substituted with a substituent having a binding site, the cross-linked polymerization product may have a denser and more rigid structure because the number of binding sites in the cross-linkable composition which are capable of cross-linking are increased.

Furthermore, because the monomer represented by Chemical Formula 1 has a water-repellent property, it may reduce or effectively prevent the inflow of moisture from the outside.

The monomer represented by Chemical Formula 1 may include a monomer represented by the following Chemical Formula 1A.

Chemical Formula 1A

In the Chemical Formula 1A, $R_1$ to $R_4$ are the same as defined in Chemical Formula 1, and $R_a$ to $R_d$ are independently selected from the group consisting of hydrogen, a substituted or unsubstituted $C_1$ to $C_{20}$ alkyl, a halogen-containing group, a hydroxyl, and a combination thereof.

The monomer represented by Chemical Formula 1A may be divinyl benzene in which each of $R_1$ to $R_4$ and $R_a$ to $R_d$ is hydrogen.

In addition, the monomer represented by Chemical Formula 1A may include at least one monomer selected from the group consisting of the following Chemical Formula 1AA:

Chemical Formula 1AA and a combination thereof.

In Chemical Formula 1AA, $R_1$ to $R_4$ are the same as defined in Chemical Formula 1.

The monomer represented by Chemical Formula 1 may be included in an amount of about 5 to about 70 volume percent ("%"), specifically about 10 to about 65 volume %, more specifically about 20 to about 55 volume %, based on the total amount of the cross-linkable composition. When the monomer is included within the foregoing range, the monomer has a suitable cross-linking density, which is sufficient to reduce or effectively prevent moisture inflow from the outside and a reduction in volume. Thereby, the monomer does not cause the light emitting body to be phase-separated, so it is possible to provide a uniform light emitting body-polymer composite.

The cross-linkable composition may further include a monomer represented by the following Chemical Formula 2.

Chemical Formula 2

In Chemical Formula 2, $R_5$ to $R_8$ are independently selected from the group consisting of hydrogen, a substituted or unsubstituted $C_1$ to $C_{20}$ alkyl, a $C_3$ to $C_{20}$ cycloalkyl, a $C_1$ to $C_{20}$ heterocycloalkyl, a $C_2$ to $C_{16}$ alkynyl, a substituted or unsubstituted $C_6$ to $C_{20}$ aryl, a substituted or unsubstituted $C_1$ to $C_{20}$ alkoxy, a $C_7$ to $C_{13}$ arylalkyl, a $C_1$ to $C_4$ oxyalkyl, a $C_1$ to $C_{20}$ heteroalkyl, a $C_3$ to $C_{20}$ heteroarylalkyl, a nitro, a cyano, an amino, an azido, an amidino, a hydrazino, a hydrazono, a carbonyl, a carbamyl, a thiol, an ester, a carboxyl or a salt thereof, a sulfonic acid or a salt thereof, a phosphoric acid or a salt thereof, a halogen-containing group, and a combination thereof, provided that at least one of $R_7$ and $R_8$ is a $C_1$ to $C_{20}$ alkyl.

The monomer represented by Chemical Formula 2 may be an alkyl (meth)acrylate monomer in which each of $R_5$ and $R_6$ is hydrogen and each of $R_7$ and $R_8$ is a $C_1$ to $C_{20}$ alkyl group.

The monomer represented by Chemical Formula 2 may be cross-linked in the center of the acryl group. In addition, since an alkyl group in the terminal position has high hydrophobicity, it may reduce or effectively prevent moisture inflow from the outside and phase separation from the light emitting body when a polymer composition is formed during manufacture, for example.

The monomer represented by Chemical Formula 2 may be included in an amount of about 30 to about 95 volume %, specifically about 40 to about 85 volume %, more specifically about 50 to about 75 volume %, based on the total amount of cross-linkable composition. When the monomer of Chemical Formula 2 is included in the foregoing range, it is believed to reduce or effectively prevent moisture inflow from outside and phase separation from the light emitting body by being cross-linked in a dense structure.

The cross-linkable composition may further include a monomer represented by the following Chemical Formula 3.

Chemical Formula 3

In Chemical Formula 3, $Ar_2$ is a substituted or unsubstituted $C_6$ to $C_{20}$ aryl, $R_9$ and $R_{10}$ are independently selected from the group consisting of hydrogen, a substituted or unsubstituted $C_1$ to $C_{20}$ alkyl, a $C_3$ to $C_{20}$ cycloalkyl, a $C_1$ to $C_{20}$ heterocycloalkyl, a $C_2$ to $C_{16}$ alkynyl, a substituted or unsubstituted $C_6$ to $C_{20}$ aryl, a substituted or unsubstituted $C_1$ to $C_{20}$ alkoxy, a $C_7$ to $C_{13}$ arylalkyl, a $C_1$ to $C_4$ oxyalkyl, a $C_1$ to $C_{20}$ heteroalkyl, a $C_3$ to $C_{20}$ heteroarylalkyl, a nitro, a cyano, an amino, an azido, an amidino, a hydrazino, a hydrazono, a carbonyl, a carbamyl, a thiol, an ester, a carboxyl or a salt thereof, a sulfonic acid or a salt thereof, a phosphoric acid or a salt thereof, a halogen-containing group, and a combination thereof.

The monomer represented by Chemical Formula 3 may be a monomer represented by the following Chemical Formula 3A.

Chemical Formula 3A

In Chemical Formula 3A, $R_9$ and $R_{10}$ are the same as defined in Chemical Formula 3, and $R_e$ to $R_i$ are independently selected from the group consisting of hydrogen, a substituted or unsubstituted $C_1$ to $C_{20}$ alkyl, a halogen-containing group, a hydroxyl, and a combination thereof.

The monomer represented by Chemical Formula 3A may be a styrene monomer in which each of $R_9$ and $R_{10}$ and $R_e$ to $R_i$ is hydrogen.

The monomer represented by Chemical Formula 3 may be included in an amount of about 2 to about 50 volume %, specifically about 4 to about 45 volume %, more specifically about 6 to about 40 volume %, based on the total amount of the cross-linkable composition. When the monomer of Chemical Formula 3 is included in the range, the light emitting body-polymer composite may improve a heat resistance and a hydrophobicity, reducing or effectively preventing thermal distortion by heat generated from a light source.

The cross-linkable composition may further include a monomer having at least two acrylate groups. The monomer having at least two acrylate groups may include a di(meth)acrylate monomer represented by Chemical Formula 4.

Chemical Formula 4

The di(meth)acrylate monomer of Chemical Formula 4 may include, for example 1,12-dodecanediol di(meth)acrylate, 1,3-butyleneglycol di(meth)acrylate, 1,4-butanediol di(meth)acrylate, 1,4-butanediol di(meth)acrylate, 1,6-hexanediol di(meth)acrylate, cyclohexane dimethanol di(meth)acrylate, diethylene glycol di(meth)acrylate, ethoxylated bisphenol A di(meth)acrylate, ethylene glycol di(meth)acrylate, neopentyl glycol di(meth)acrylate, polyethylene glycol 400 di(meth)acrylate, polyethylene glycol 600 di(meth)acrylate, polyethylene glycol 1000 di(meth)acrylate, tetraethylene glycol di(meth)acrylate, triethylene glycol di(meth)acrylate, polybutadiene di(meth)acrylate, or a combination thereof.

In the Chemical Formula 4, $R_{11}$ to $R_{16}$ are independently selected from the group consisting of hydrogen, a substituted or unsubstituted $C_1$ to $C_{20}$ alkyl, a $C_3$ to $C_{20}$ cycloalkyl, a $C_1$ to $C_{20}$ heterocycloalkyl, a $C_2$ to $C_{16}$ alkynyl, a substituted or unsubstituted $C_6$ to $C_{20}$ aryl, a substituted or unsubstituted $C_1$ to $C_{20}$ alkoxy, a $C_7$ to $C_{13}$ arylalkyl, a $C_1$ to $C_4$ oxyalkyl, a $C_1$ to $C_{20}$ heteroalkyl, a $C_3$ to $C_{20}$ heteroarylalkyl, a nitro, a cyano, an amino, an azido, an amidino, a hydrazino, a hydrazono, a carbonyl, a carbamyl, a thiol, an ester, a carboxyl or a salt thereof, a sulfonic acid or a salt thereof, a phosphoric acid or a salt thereof, a halogen-containing group, and a combination thereof, and $R_{17}$ is selected from the group consisting of a substituted or unsubstituted $C_1$ to $C_{20}$ alkylene, a substituted or unsubstituted $C_3$ to $C_{20}$ cycloalkylene, a substituted or unsubstituted $C_6$ to $C_{20}$ arylene, a substituted or unsubstituted $C_2$ to $C_{20}$ heteroarylene, and a combination thereof.

The monomer may include a plurality of acrylate groups, and in an embodiment three acrylate groups, and may include, for example, ethoxylated (15) trimethylolpropane tri(meth)acrylate, ethoxylated (3) trimethylolpropane tri(meth)acrylate, ethoxylated (6) trimethylolpropane tri(meth)acrylate, ethoxylated (9) trimethylolpropane tri(meth)acrylate, ethoxylated (20) trimethylolpropane tri(meth)acrylate, highly propoxylated (5.5) glyceryl tri(meth)acrylate, low viscosity trimethylolpropane tri(meth)acrylate, pentaerythritol tri(meth)acrylate, propoxylated (3) glyceryl tri(meth)acrylate, propoxylated (3) trimethylolpropane tri(meth)acrylate, propoxylated (6) trimethylolpropane tri(meth)acrylate, trimethylolpropane tri(meth)acrylate, tris(2-hydroxyethyl)isocyanurate tri(meth)acrylate, or a combination thereof.

The monomer may include four acrylate groups, and may include, for example, di-trimethylolpropane tetra(meth)acrylate, pentaerythritol tetra(meth)acrylate, dipentaerythritol penta(meth)acrylate, ethoxylated (4) pentaerythritol tetra(meth)acrylate, low viscosity dipentaerythritol penta(meth)acrylate, penta(meth)acrylate ester, or a combination thereof.

The monomer having at least two acrylate groups may be included in an amount of about 2 to about 50 volume %, specifically about 4 to about 45 volume %, more specifically about 6 to about 40 volume %, based on the total amount of cross-linkable composition.

The polymer formed by cross-linking the cross-linkable composition may have a refractive index of about 1 to about 2, specifically about 1.4 to about 1.6, more specifically about 1.5. When the polymer has the foregoing refractive index, a light emitting body-polymer composite absorbs light from a light source, and thereby the light emitting efficiency may be increased.

The polymer resin 150 surrounds the light emitting body-polymer composite 140 and seals (e.g., hermetically seals) a light emitting part 120 and a medium part 125. The polymer resin 150 may be on a surface of the light emitting body-polymer composite 140.

The polymer resin 150 may comprise a transparent material, which is capable of passing the light supplied from the light source 120 and the light supplied from light emitting body 141, and it may include, for example, an epoxy resin, a silicone resin, or a combination thereof.

Hereinafter, a method of fabricating the light emitting device is further disclosed.

Firstly, a transparent resin composition is prepared to provide a transparent resin layer 130.

First, a cross-linkable composition including the monomer is prepared. Then a polymerization initiator is added to and mixed with the cross-linkable composition. The polymerization initiator may include, for example, a thermal polymerization initiator, a photopolymerization initiator, an ion polymerization initiator, an emulsion polymerization initiator, a suspension polymerization initiator, or a combination thereof.

Subsequently, a light emitting body 141 is mixed with the cross-linkable composition, and the mixture of the cross-linkable composition and the light emitting body 141 is polymerized to provide a light emitting body-polymer composite 140. The polymerization may be selected from the group consisting of thermal polymerization, photopolymerization, ion polymerization, suspension polymerization, emulsion polymerization, or a combination thereof.

Then the obtained light emitting body-polymer composite 140 is dried under reduced pressure, and the dried light emitting body-polymer composite 140 is pulverized to provide a particle having a selected shape, which may be a spherical shape.

Subsequently, the light emitting body-polymer composite 140 having a particle shape is mixed with a resin composition 150, such as an epoxy resin, a silicone resin, or a combination thereof.

A mixed solution of the light emitting body-polymer composite 140 and the resin composition 150 is dried under reduced pressure to remove air and moisture from the mixed solution.

The mixed solution of the light emitting body-polymer composite 140 and the resin composition 150 is then disposed on a light source 120, including a light emitting diode, and a medium layer 125, and the mixed solution is hardened.

Hereinafter, a light emitting device according to another embodiment is described with reference to FIG. 2.

Figure 2:
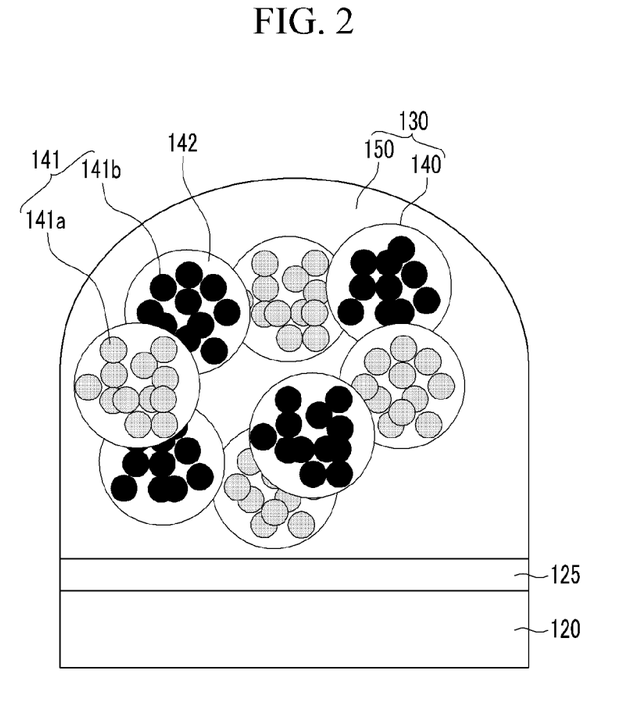
FIG. 2 is a schematic view showing an exemplary embodiment of another light emitting device.

FIG. 2 is a schematic view showing a light emitting device according to another embodiment.

Referring to FIG. 2, the light emitting device may include a light source 120 including a light emitting diode, a medium layer 125, and a transparent resin layer 130 including a light emitting body-polymer composite 140 and a polymer resin 150 as in the above embodiment.

However, differing from the above embodiment, each light emitting body-polymer composite 140 includes a single type of light emitting body 141, which emits light of a single selected color. In other words, each light emitting body-polymer composite 140, which may have a spherical shape, may include a first light emitting body 141a, and another light emitting body-polymer composite 140 includes a second light emitting body 141b, and wherein, in an embodiment, the first light emitting body and the second light emitting body are different and emit light of a different wavelength.

In an embodiment, white light is expressed by a combination of light emitted from the light emitting diode, light emitted from the first light emitting body 141a, and light emitted from the second light emitting body 141b. For better understanding, clarity, and ease of description, only two kinds of light emitting bodies 141a and 141b are disclosed in the foregoing description, but the light emitting device is not limited thereto. The light emitting device may include various kinds of light emitting bodies.

Hereinafter, a light emitting device according to another embodiment is described with reference to FIG. 3.

Figure 3:
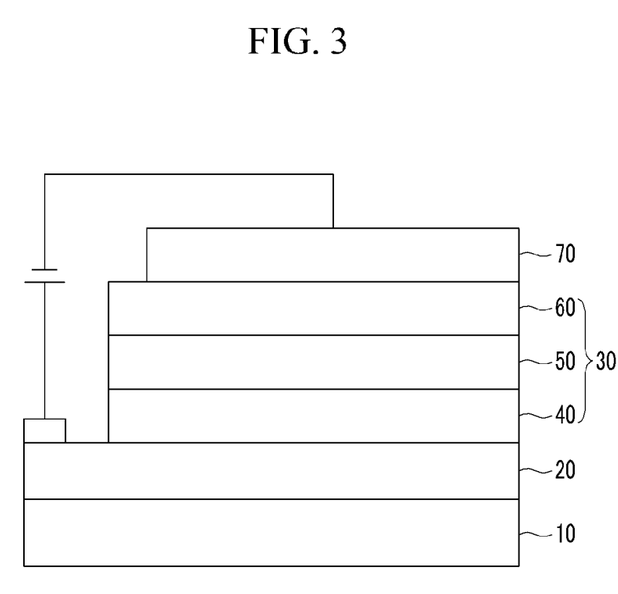
FIG. 3 is a cross-sectional view showing an exemplary embodiment of another light emitting device.

FIG. 3 is a cross-sectional view showing a light emitting device according to another embodiment.

Referring to FIG. 3, in the light emitting device, a pair of electrodes, including a first electrode 20 and a second electrode 70, are disposed facing each other on a substrate 10, which may comprise glass, plastic, or a combination thereof, and a light emitting member 30 is interposed between the first electrode 20 and the second electrode 70.

Either the first electrode 20 or the second electrode 70 may be an anode, and the other electrode may be a cathode.

The light emitting member 30 includes an emission layer 50 and a first and a second auxiliary layers 40 and 60, respectively.

The emission layer 50 may include a light emitting body, which inherently emits light having one color, such as one of the three primary colors red, green, and blue. The light emitting device may express white light by combining the light from the light emitting bodies. The emission layer 50 includes the light emitting body-polymer composite, which is further disclosed above, thus further detailed description thereof is omitted for clarity.

The first and second auxiliary layers 40 and 60, respectively, are disposed between the first electrode 20 and the emission layer 50 and between the emission layer 50 and the second electrode 70, respectively, and may facilitate charge transport from the first and second electrodes 20 and 70 to the emission layer 50, so as to increase luminous efficiency. The first and second auxiliary layers 40 and 60 may include one layer or may comprise at least two layers, and may be omitted if desired.

The following examples illustrate the disclosed embodiments in further detail. However, it is understood that this disclosure is not limited by these examples.

Transparent Resin Composition Preparation—1

A divinyl benzene monomer ("DVB"), a lauryl methacrylate monomer ("LMA"), and a styrene monomer ("ST") are mixed in the amount shown in Table 1 to provide each cross-linkable composition according to Examples 1 and 2. Furthermore, a cross-linkable composition including only an acrylate monomer ("Ac") according to Comparative Example 1 is also prepared.

Then 0.015 gram (g) of a polymerization initiator of azobisisobutyronitrile ("AIBN") is added to each cross-linkable composition. A quantum dot with a core and shell that include InP and ZnS, respectively, is synthesized and precipitated using ethanol. A 0.1 milliliter (ml) quantity of the precipitate is added to each cross-linkable composition and the composition uniformly mixed. Subsequently, the cross-linkable composition including the quantum dot is measured to determine a concentration using a UV-visible spectrometer and the concentration of the precipitate is adjusted to provide an optical density of 0.1.

The cross-linkable composition is polymerized at a temperature of 80° C. to provide a light emitting body-polymer composite, and dried at 40° C. under reduced pressure. The dried light emitting body-polymer composite is pulverized to provide a particulate having a size of 50 micrometers (μm) or less. A 0.1 g quantity of the obtained light emitting body-polymer composite and an amine-based hardener are mixed in 0.2 ml of epoxy resin to provide a transparent resin composition.

TABLE 1

|  | DVB (ml) | LMA (ml) | ST (ml) | Ac (ml) |
| --- | --- | --- | --- | --- |
| Example 1 | 0.2 | 0.3 | — | — |
| Example 2 | 0.2 | 0.15 | 0.15 | — |
| Comparative Example 1 | — | — | — | 0.5 |

Light Emitting Device Fabrication and Analysis of Characteristics

Each transparent resin composition obtained from Examples 1, 2, and Comparative Example 1 is coated on a InGaN light emitting diode and hardened at a temperature of 120° C. for 2 hours to provide a light emitting device.

An electric current of 20 mA is applied to the light emitting device to measure luminance and power conversion efficiency ("PCE") of the light emitted from the light emitting device. The results are shown in FIG. 4 to FIG. 7.

Figure 4:
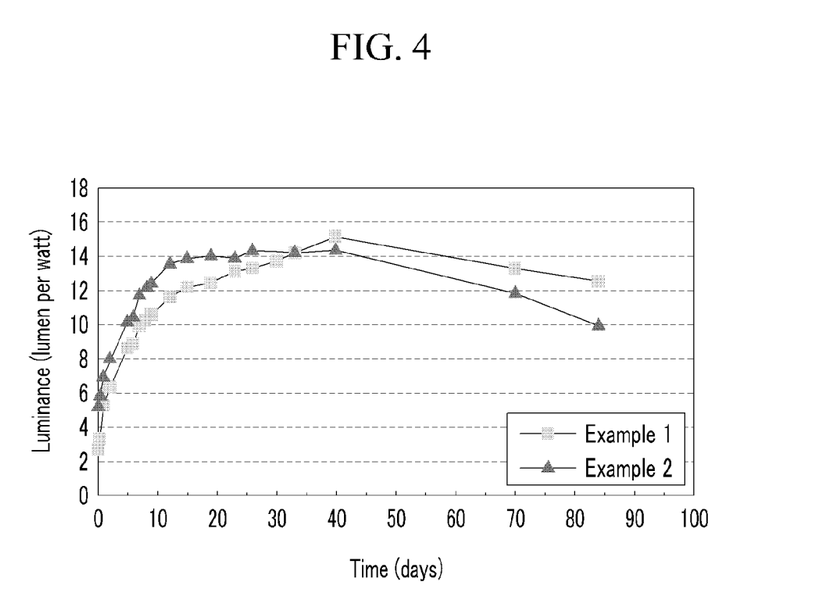
FIG. 4 is a graph illustrating luminance (lumens per watt, lm/W) versus time (days) of the light emitting devices according to Examples 1 and 2.
Figure 5:
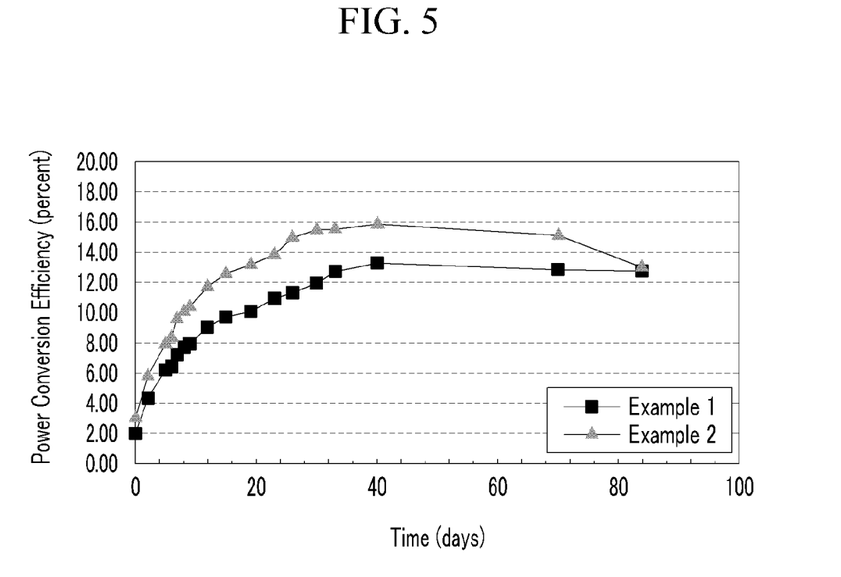
FIG. 5 is a graph illustrating power conversion efficiency (percent) versus time (days) of the light emitting devices according to Examples 1 and 2.
Figure 6:
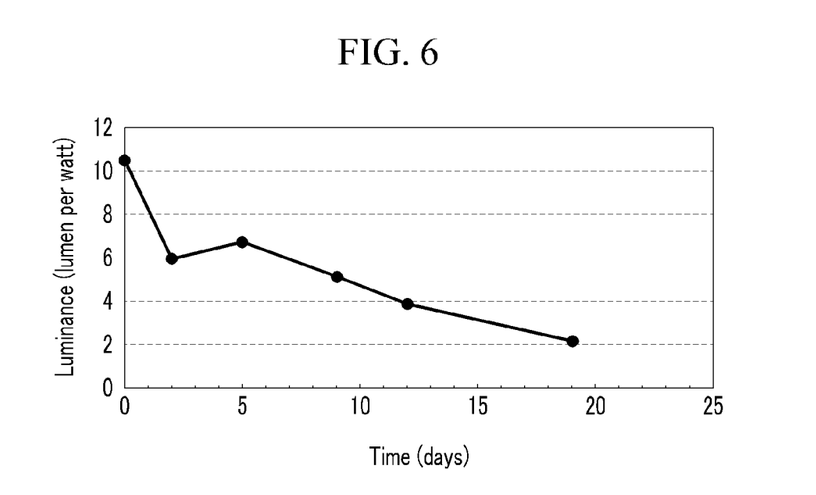
FIG. 6 is a graph illustrating luminance (lumens per watt) versus time (days) of the light emitting device according to Comparative Example 1.
Figure 7:
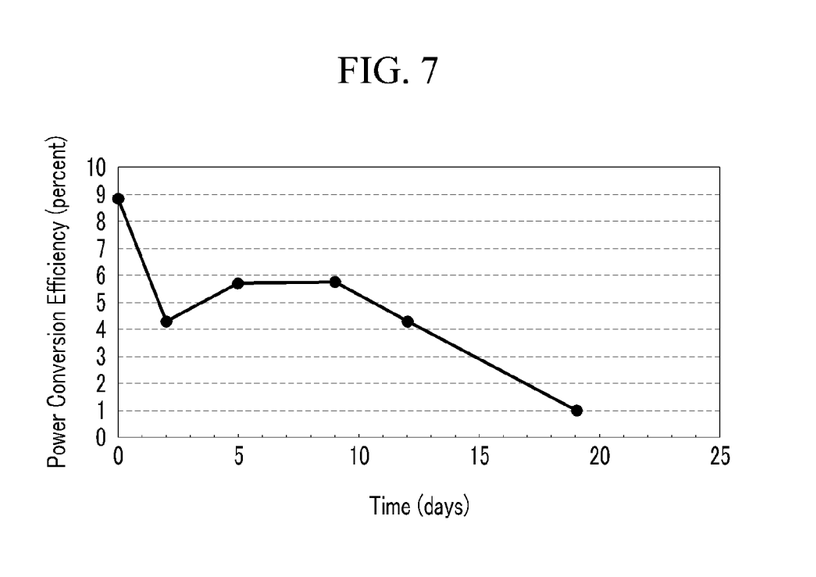
FIG. 7 is a graph illustrating power conversion efficiency (percent) versus time (days) of the light emitting device according to Comparative Example 1.

FIGS. 4 and 5 are graphs showing changes of luminance and power conversion efficiency of the light emitting devices according to Examples 1 and 2 over time. More specifically, FIG. 4 is a graph illustrating lumanance (lumens per watt) versus time (days) of the light emitting devices according to Examples 1 and 2 over time; and FIG. 5 is a graph illustrating power conversion efficiency (percent) versus time (days) of the light emitting devices according to Examples 1 and 2. FIGS. 6 and 7 are graphs showing changes of luminance and power conversion efficiency of the light emitting device according to Comparative Example 1. More specifically, FIG. 6 is a graph illustrating lumanance (lumens per watt) versus time (days) of the light emitting device according to Comparative Example 1; and FIG. 7 is a graph illustrating power conversion efficiency (percent) versus time (days) of the light emitting device according to Comparative Example 1 over time.

Referring to FIG. 4 and FIG. 6, the light emitting devices comprising transparent resin compositions according to Examples 1 and 2 have a luminance (e.g. luminous efficacy) of about 10 lumens per watt (lm/W) or more after about 84 days. On the other hand, the transparent resin composition according to Comparative Example 1 has significantly decreased luminance after two days, and the luminance decreased to about 2 lm/W or less after about 20 days. While not wanting to be bound by theory, it is understood that this result shows that moisture or oxygen inflow from outside deteriorates the light emitting body.

Furthermore, referring to FIG. 5 and FIG. 7, it is confirmed that the light emitting devices using the transparent resin compositions according to Example 1 and Example 2 maintain a power conversion efficiency of 10% or more after about 84 days. On the other hand, the transparent resin composition according to Comparative Example 1 has remarkably decreased power conversion efficiency after two days, and the power conversion efficiency decreased to about 1% after about 20 days. This result shows that the light emitting body is deteriorated due to the external moisture or oxygen inflow.

Preparing Resin Composition—2

A divinylbenzene monomer ("DVB"), a lauryl methacrylate monomer ("LMA"), a styrene monomer ("ST"), and ethylene glycol dimethacrylate ("EGDMA") are mixed in the relative amounts shown in Table 2 to provide each cross-linkable composition according to Examples 3 to 8 and Comparative Examples 2 and 3. Then a transparent resin composition is prepared in accordance with the same procedure disclosed above.

TABLE 2

|  | DVB | LMA | ST | EGDMA |
| --- | --- | --- | --- | --- |
| Example 3 | 0.2 | 0.8 | — | — |
| Example 4 | 0.4 | 0.6 | — | — |
| Example 5 | 0.6 | 0.4 | — | — |
| Example 6 | 0.4 | 0.3 | 0.3 | — |
| Example 7 | 0.6 | 0.3 | 0.1 | — |
| Example 8 | 0.2 | 0.6 | 0.2 | 0.4 |
| Comparative Example 2 | — | 0.6 | — | 0.4 |
| Comparative Example 3 | — | 0.8 | — | 0.2 |

Each transparent resin composition according to Examples 3 to 8 is measured to determine a refractive index. The results show that the transparent resin compositions according to Examples 3 to 8 have refractive indexes of 1.493, 1.517, 1.541, 1.555, 1.542, and 1.529, respectively, which corresponds to a range of about 1.4 to about 1.6.

Light Emitting Device Fabrication and Analysis of Characteristics

A light emitting device is fabricated using each transparent resin composition according to Examples 3 to 8 and Comparative Examples 2 and 4 in accordance with the same procedure disclosed above, and the characteristics of the light emitting device are analyzed.

Figure 8:
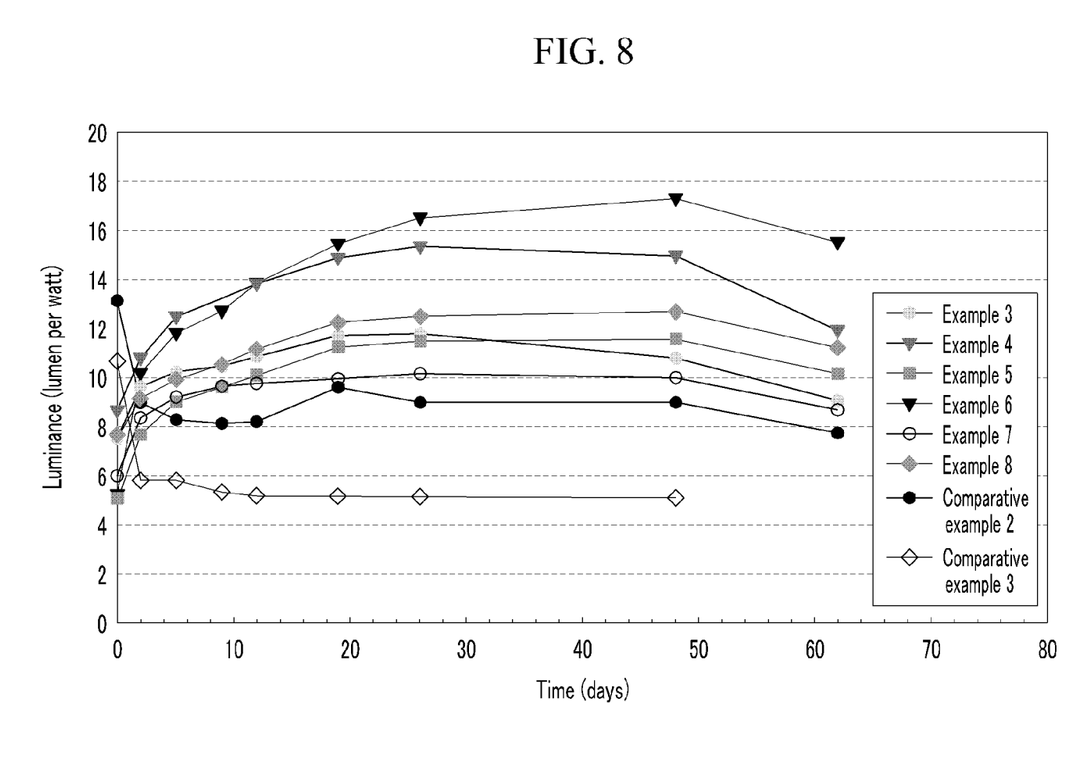
FIG. 8 is a graph illustrating luminance (lumens per watt) versus time (days) of the light emitting device according to Examples 3 to 8 and Comparative Examples 2 and 3.

The results are shown in FIG. 8. FIG. 8 is a graph showing the luminance of the light emitting device (lumens per watt) versus time (days) according to Examples 3 to 8 and Comparative Examples 2 and 3.

Referring to FIG. 8, it is confirmed that light emitting devices using the transparent resin compositions according to Examples 3 to 8 maintain luminance of about 8 lm/W or more after about 60 days. On the other hand, it is also confirmed that light emitting devices using transparent resin compositions according to Comparative Example 2 and 3 have very high early luminance, but the luminance remarkably decreases with the passage of time. While not wanting to be bound by theory, these results are understood to show that the light emitting body deteriorates due to inflow of external moisture or oxygen with the passage of time.

It is also confirmed that the disclosed light emitting device provides stable transparency and prevents the light emitting body from deteriorating over time, therefore it is possible to maintain the light emitting characteristics of the device for a long time.

While this invention has been described in connection with exemplary embodiments, it is to be understood that the invention is not limited to the disclosed embodiments, but, on the contrary, is intended to cover various modifications and equivalent arrangements included within the spirit and scope of the appended claims.

What is claimed is:

1. A composition for a light emitting body-polymer composite, the composition comprising:
   a light emitting body, and
   a cross-linkable composition comprising
   a monomer represented by the following Chemical Formula 1A:

Chemical Formula 1A wherein $R_1$ to $R_4$ are independently selected from the group consisting of hydrogen, a substituted or unsubstituted $C_1$ to $C_{20}$ alkyl, a $C_3$ to $C_{20}$ cycloalkyl, a $C_1$ to $C_{20}$ heterocycloalkyl, a $C_2$ to $C_{16}$ alkynyl, a substituted or unsubstituted $C_6$ to $C_{20}$ aryl, a substituted or unsubstituted $C_1$ to $C_{20}$ alkoxy, a $C_7$ to $C_{13}$ arylalkyl, a $C_1$ to $C_4$ oxyalkyl, a $C_1$ to $C_{20}$ heteroalkyl, a $C_3$ to $C_{20}$ heteroarylalkyl, a nitro, a cyano, an amino, an azido, an amidino, a hydrazino, a hydrazono, a carbonyl, a carbamyl, a thiol, an ester, a carboxyl or a salt thereof, a sulfonic acid or a salt thereof, a phosphoric acid or a salt thereof, a halogen-containing group, and a combination thereof, and $R_a$ to $R_d$ are independently selected from the group consisting of hydrogen, a substituted or unsubstituted $C_1$ to $C_{20}$ alkyl, a halogen-containing group, a hydroxyl, and a combination thereof, and a monomer represented by the following Chemical Formula 2:

Chemical Formula 2 wherein each of $R_5$ and $R_6$ is hydrogen and each of $R_7$ and $R_8$ is a $C_1$ to $C_{20}$ alkyl group, and wherein the cross-linkable composition further comprises a monomer represented by the following Chemical Formula 3A and a monomer including at least two (meth) acrylate groups:

Chemical Formula 3A wherein $R_9$ and $R_{10}$ are independently selected from the group consisting of hydrogen, a substituted or unsubstituted $C_1$ to $C_{20}$ alkyl, a $C_3$ to $C_{20}$ cycloalkyl, a $C_1$ to $C_{20}$ heterocycloalkyl, a $C_2$ to $C_{16}$ alkynyl, a substituted or unsubstituted $C_6$ to $C_{20}$ aryl, a substituted or unsubstituted $C_1$ to $C_{20}$ alkoxy, a $C_7$ to $C_{13}$ arylalkyl, a $C_1$ to $C_4$ oxyalkyl, a $C_1$ to $C_{20}$ heteroalkyl, a $C_3$ to $C_{20}$ heteroarylalkyl, a nitro, a cyano, an amino, an azido, an amidino, a hydrazino, a hydrazono, a carbonyl, a carbamyl, a thiol, an ester, a carboxyl or a salt thereof, a sulfonic acid or a salt thereof, a phosphoric acid or a salt thereof, a halogen-containing group, and a combination thereof, and $R_e$ to $R_i$ independently selected from the group consisting of hydrogen, a substituted or unsubstituted $C_1$ to $C_{20}$ alkyl, a halogen-containing group, a hydroxyl, and a combination thereof, and wherein the monomers represented by Chemical Formula 1, Chemical Formula 2, and Chemical Formula 3 are included in an amount of about 10 to about 65 volume percent, about 30 to about 85 volume percent, and greater than 0 to about 50 volume percent, respectively, and wherein the monomer including at least two (meth)acrylate groups is included in an amount of about 2 to about 50 volume percent, based on the total volume of the cross-linkable composition.

2. The composition of claim 1, wherein the monomer represented by Chemical Formula 1A comprises a monomer represented by the following Chemical Formula 1AA:

Chemical Formula 1AA or a combination thereof, wherein $R_1$ to $R_4$ are the same as defined in the Chemical Formula 1.

3. The composition of claim 1, wherein the monomer represented by Chemical Formula 1 and the monomer represented by Chemical Formula 2 are included in an amount of about 10 to about 65 volume percent and about 40 to about 85 volume percent, respectively, based on the total volume of the cross-linkable composition.

4. The composition of claim 1, wherein the monomer represented by Chemical Formula 3 is included in an amount of about 2 to about 50 volume percent, based on the total volume of the cross-linkable composition.

5. The composition of claim 1, wherein the monomer including at least two (meth)acrylate groups comprises a monomer represented by the following Chemical Formula 4:

Chemical Formula 4 wherein $R_{11}$ to $R_{16}$ are independently selected from the group consisting of hydrogen, a substituted or unsubstituted $C_1$ to $C_{20}$ alkyl, a $C_3$ to $C_{20}$ cycloalkyl, a $C_1$ to $C_{20}$ heterocycloalkyl, a $C_2$ to $C_{16}$ alkynyl, a substituted or unsubstituted $C_6$ to $C_{20}$ aryl, a substituted or unsubstituted $C_1$ to $C_{20}$ alkoxy, a $C_7$ to $C_{13}$ arylalkyl, a $C_1$ to $C_4$ oxyalkyl, a $C_1$ to $C_{20}$ heteroalkyl, a $C_3$ to $C_{20}$ heteroarylalkyl, a nitro, a cyano, an amino, an azido, a hydrazino, a hydrazono, a carbonyl, a carbamyl, a thiol, an ester, a carboxyl or a salt thereof, a sulfonic acid or a salt thereof, a phosphoric acid or a salt thereof, a halogen-containing group, and combinations thereof, and $R_{17}$ is selected from the group consisting of a substituted or unsubstituted $C_1$ to $C_{20}$ alkylene, a substituted or unsubstituted $C_3$ to $C_{20}$ cycloalkylene, a substituted or unsubstituted $C_6$ to $C_{20}$ arylene, a substituted or unsubstituted $C_2$ to $C_{20}$ heteroarylene, and a combination thereof.

6. A light emitting body-polymer composite, comprising: a cross-linked composition derived from the composition according to claim 1.

7. The light emitting body-polymer composite of claim 6, wherein the cross-linked composition has a refractive index of about 1.4 to about 1.6.

8. The composition of claim 1, wherein the monomers represented by Chemical Formula 1, Chemical Formula 2, and Chemical Formula 3 are included in an amount of about 20 to about 60 volume percent, about 30 to about 60 volume percent, and about 10 to about 30 volume percent, respectively.

9. The composition of claim 1, wherein the monomers represented by Chemical Formula 1, Chemical Formula 2, Chemical Formula 3, and the monomer including at least two (meth)acrylate groups are included in an amount of about 10 to about 65 volume percent, about 30 to about 85 volume percent, greater than 0 to about 50 volume percent, and about 2 to about 50 volume percent, respectively.

10. The composition of claim 1, wherein the monomers represented by Chemical Formula 1, Chemical Formula 2, Chemical Formula 3, and the monomer including at least two (meth)acrylate groups are included in an amount of about 20 to about 60 volume percent, about 30 to about 60 volume percent, about 10 to about 30 volume percent, and about 2 to about 50 volume percent, respectively.

11. A light emitting device, comprising:
a light emitting body-polymer composite including a light emitting body and a cross-linked resin,
wherein the cross-linked resin comprises a polymerization product of a cross-linkable composition comprising the monomer represented by Chemical Formula 1:

Chemical Formula 1A wherein $R_1$ to $R_4$ are independently selected from the group consisting of hydrogen, a substituted or unsubstituted $C_1$ to $C_{20}$ alkyl, a $C_3$ to $C_{20}$ cycloalkyl, a $C_1$ to $C_{20}$ heterocycloalkyl, a $C_2$ to $C_{16}$ alkynyl, a substituted or unsubstituted $C_6$ to $C_{20}$ aryl, a substituted or unsubstituted $C_1$ to $C_{20}$ alkoxy, a $C_7$ to $C_{13}$ arylalkyl, a $C_1$ to $C_4$ oxyalkyl, a $C_1$ to $C_{20}$ heteroalkyl, a $C_3$ to $C_{20}$ heteroarylalkyl, a nitro, a cyano, an amino, an azido, an amidino, a hydrazino, a hydrazono, a carbonyl, a carbamyl, a thiol, an ester, a carboxyl or a salt thereof, a sulfonic acid or a salt thereof, a phosphoric acid or a salt thereof, a halogen-containing group, and a combination thereof, and
$R_a$ to $R_d$ are independently selected from the group consisting of hydrogen, a substituted or unsubstituted $C_1$ to $C_{20}$ alkyl, a halogen-containing group, a hydroxyl, and a combination thereof, and
a monomer represented by the following Chemical Formula 2:

Chemical Formula 2 wherein each of $R_5$ and $R_6$ is hydrogen and each of $R_7$ and $R_8$ is a $C_1$ to $C_{20}$ alkyl group, and
wherein the cross-linkable composition further comprises a monomer represented by the following Chemical Formula 3A and a monomer including at least two (meth) acrylate groups:

Chemical Formula 3A wherein $R_9$ and $R_{10}$ are independently selected from the group consisting of hydrogen, a substituted or unsubstituted $C_1$ to $C_{20}$ alkyl, a $C_3$ to $C_{20}$ cycloalkyl, a $C_1$ to $C_{20}$ heterocycloalkyl, a $C_2$ to $C_{16}$ alkynyl, a substituted or unsubstituted $C_6$ to $C_{20}$ aryl, a substituted or unsubstituted $C_1$ to $C_{20}$ alkoxy, a $C_7$ to $C_{13}$ arylalkyl, a $C_1$ to $C_4$ oxyalkyl, a $C_1$ to $C_{20}$ heteroalkyl, a $C_3$ to $C_{20}$ heteroarylalkyl, a nitro, a cyano, an amino, an azido, an amidino, a hydrazino, a hydrazono, a carbonyl, a carbamyl, a thiol, an ester, a carboxyl or a salt thereof, a sulfonic acid or a salt thereof, a phosphoric acid or a salt thereof, a halogen-containing group, and a combination thereof, and $R_e$ to $R_i$ are independently selected from the group consisting of hydrogen, a substituted or unsubstituted $C_1$ to $C_{20}$ alkyl, a halogen-containing group, a hydroxyl, combination thereof, and wherein the monomers represented by Chemical Formula 1, Chemical Formula 2, and Chemical Formula 3 are included in an amount of about 10 to about 65 volume percent, about 30 to about 85 volume percent, and greater than 0 to about 50 volume percent, respectively, and wherein the monomer including at least two (meth)acrylate groups is included in an amount of about 2 to about 50 volume percent, based on the total volume of the cross-linkable composition.

12. The light emitting device of claim 11, wherein the light emitting device further comprises a light emitting diode that provides the light emitting body-polymer composite with light.

13. The light emitting device of claim 12, wherein light emitting diode and the light emitting body emit light,
the light emitting body emits light having a wavelength which is longer than a wavelength the light emitted from the light emitting diode, and
the combination of the light emitting diode and the light emitting body emit white light.

14. The light emitting device of claim 11, wherein the light emitting device further comprises a first electrode disposed on a first side of the light emitting body-polymer composite, and a second electrode disposed on a second side the light emitting body-polymer composite, wherein the first side is opposite the second side.

15. The light emitting device of claim 11, wherein the light emitting body-polymer composite has a spherical shape.

16. The light emitting device of claim 15, wherein the light emitting device further comprises a polymer resin surrounding the light emitting body-polymer composite.

17. The light emitting device of claim 16, wherein the polymer resin comprises an epoxy resin, a silicone resin, or a combination thereof.

* * * * *